(12) United States Patent
Yen et al.

(10) Patent No.: US 8,975,979 B2
(45) Date of Patent: *Mar. 10, 2015

(54) TRANSFORMER WITH BYPASS CAPACITOR

(71) Applicant: Taiwan Semiconductor Manufacturing Co., Ltd., Hsin-Chu (TW)

(72) Inventors: Hsiao-Tsung Yen, Tainan (TW); Yu-Ling Lin, Taipei (TW); Ying-Ta Lu, Fanlu Township (TW); Chin-Wei Kuo, Zhubei (TW); Ho-Hsiang Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/017,612

(22) Filed: Sep. 4, 2013

(65) Prior Publication Data

US 2014/0041173 A1 Feb. 13, 2014

Related U.S. Application Data

(63) Continuation of application No. 12/963,701, filed on Dec. 9, 2010, now Pat. No. 8,552,812.

(51) Int. Cl.
*H03H 7/42* (2006.01)
*H01L 23/522* (2006.01)
(Continued)

(52) U.S. Cl.
CPC ........ *H01L 23/5227* (2013.01); *H01L 23/5223* (2013.01); *H01F 17/0006* (2013.01); *H01F 2017/0086* (2013.01); *H01L 2924/0002* (2013.01)
USPC ............................................. 333/25; 336/200

(58) Field of Classification Search
CPC .............. H03H 7/42; H03H 7/09; H01P 5/10; H01P 3/05; H01P 3/081; H01P 3/082; H01F 17/0013
USPC ........................ 333/25, 26, 177, 238; 336/200
See application file for complete search history.

(56) References Cited

U.S. PATENT DOCUMENTS 5,015,972 A  5/1991 Cygan et al.
5,477,204 A  12/1995 Li
(Continued)

FOREIGN PATENT DOCUMENTS

CN  1545110 A  11/2004

OTHER PUBLICATIONS

Ng, A.W. et al., "A 1V 17GHz 5mW Quadrature CMOC VCO based on Transformer Coupling", IEEE International Solid-State Circuits Conference, 2006, Session 11, RF Building Blocks and PLLS/11.4, pp. 1-10.

(Continued)

*Primary Examiner* — Dean Takaoka
(74) *Attorney, Agent, or Firm* — Duane Morris LLP; Steven E. Koffs

(57) ABSTRACT

An electronic device comprises first, second and third inductors connected in series and formed in a metal layer over a semiconductor substrate. The first and second inductors have a mutual inductance with each other. The second and third inductors having a mutual inductance with each other. A first capacitor has a first electrode connected to a first node. The first node is conductively coupled between the first and second inductors. A second capacitor has a second electrode connected to a second node. The second node is conductively coupled between the second and third inductors.

20 Claims, 9 Drawing Sheets

(51) Int. Cl.
*H01F 17/00* (2006.01)
*H01F 17/02* (2006.01)

(56) References Cited

U.S. PATENT DOCUMENTS

| | | | |
|---|---|---|---|
| 6,949,442 B2 | 9/2005 | Barth et al. | |
| 8,072,290 B2 | 12/2011 | Rofougaran et al. | |
| 8,552,812 B2 * | 10/2013 | Yen et al. | 333/25 |
| 2007/0155112 A1 | 7/2007 | Park | |

OTHER PUBLICATIONS

Nakamura, T. et al., "A 20-GHz 1-V VCO with Dual-Transformer Configuration and a Pseudo-Static Divider on Self-Stabilized Concept", ESSCIRC, Atlanta, Sep. 2009, pp. 436-439.

Kawano, Y. et al., "A 77GHz Transceiver in 90nm CMOS", IEEE International Solid-State Circuits Conference, 2009, Session 18, Ranging and Gb/s Communication, 18.3, pp. 310-312.

Borremans, J. et al., "A Fully Integrated 7.3 kV HBM ESD-Protected Transformer-Based 4.5-6 GHz CMOS LNA", IEEE Journal of Solid State Circuits, Feb. 2009, 44(2):344-353.

Chunqi, G. et al., "A Scalable RF Model of the Metal-Oxide-Metal (MOM) Capacitor", Nanotech, 2001, vol. 1 Chapter 10—Semiconductor Device Modeling and Novel Structures Simulation, pp. 482-485.

Severino, R.R., et al., "A transformer-based 60GHz CMOS LNA for low voltage applications", IEEE International Workshop on Radio-Frequency Integration Technology, Dec. 2007, Singapore, pp. 62-65.

Yang, J. et al., "Design of a 24-GHz CMOS VCO With an Asymmetric-Width Transformer", IEEE Transactions on Circuits and Systems-II:Express Briefs, Mar. 2010, 57(3):173-177.

Huang, D. et al., "A 60GHz CMOS Differential Receiver Front-End Using On-Chip Transformer for 1.2 Volt Operation with Enhanced Gain and Linearity", Symposium on VLSI Circuits Digest of Technical Papers, 2006, 2 pages.

Chang, S. et al., "A Tunable RF MEMS Transformer on Silicon", Silicon Monolithic Integrated Circuits in RF Systems, Jan. 2007, pp. 177-180.

Official Action issued May 19, 2014 in counterpart CN patent application 201110092413.3.

* cited by examiner

TRANSFORMER WITH BYPASS CAPACITOR

This application is a continuation of U.S. patent application Ser. No. 12/963,701, filed Dec. 9, 2010, which is expressly incorporated by reference herein in its entirety.

FIELD

The disclosed system and method relate generally to transformers and balanced-to-unbalanced (balun) devices. More specifically, the disclosed system and method relate to on-chip symmetrical transformers and balun devices.

BACKGROUND

A transformer is a device that transfers electrical energy from one circuit to another through inductively coupled conductors—the transformer's windings. A varying current in the first or primary winding creates a varying magnetic field through the secondary winding. This varying magnetic field induces a varying electromotive force (EMF) or "voltage" in the secondary winding. This effect is called mutual induction. If a load is connected to the secondary winding, an electric current will flow in the secondary winding and electrical energy will be transferred from the primary circuit through the transformer to the load.

A balun is a type of transformer that can convert electrical signals that are balanced about ground (differential) to signals that are unbalanced (single-ended) and vice versa. A balun can be formed by connecting one port of a transformer to ground. Baluns are also often used for impedance matching.

Transformers and baluns are commonly used in wireless communications. For example, transformers and baluns are frequently used in transceivers in wireless communication devices. Conventional coplanar interleaved transformers used in such applications have the primary and secondary windings interleaved on the same integrated circuit layer. The primary and secondary windings are constructed of planar metal traces. The number of turns in each of the primary and secondary windings determines the ratio of the voltages in the windings.

While conventional coplanar transformers reduce the size and resistance, they suffer from low quality (Q) factors. One-turn transformers exhibit a low K (coupling coefficient) for millimeter-Wave circuit applications (for example, in the frequency range of 30 GHz-300 GHz).

Additionally, transformers in advanced technology nodes (e.g., 90 nanometer, 65 nanometer, or smaller critical dimensions) have lower Fsr (resonance frequency) than larger technology nodes.

Improved transformers are desired.

DETAILED DESCRIPTION

Figure 1A:
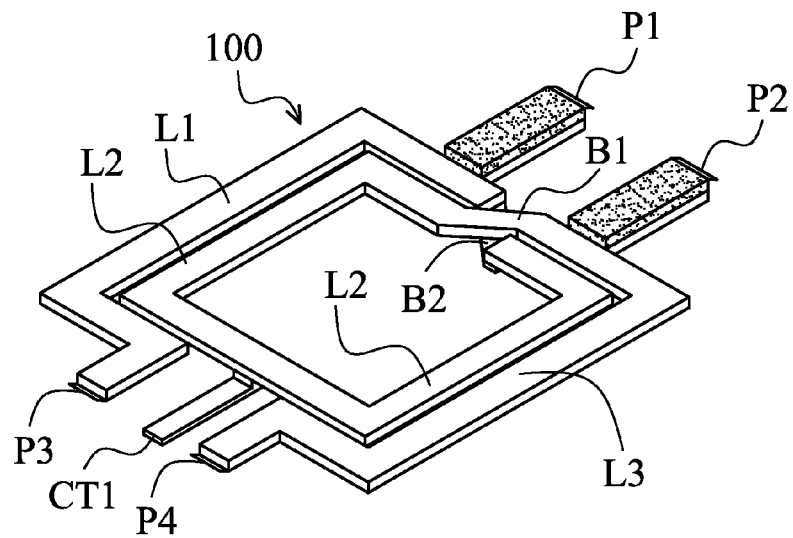
FIG. 1A is an isometric view of an example of a transformer having a generally rectangular shape.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A is an isometric view of an electronic device, which is a transformer or balun 100 for an integrated circuit (IC). The transformer/balun 100 has coils L1, L2 and L3 formed in a single-layer providing a coplanar symmetric transformer 100 having a 1:1 turn ratio. The transformer/balun 100 can be incorporated into IC designs without requiring changes to the process flow (e.g., CMOS process) or additional masks.

As shown in FIG. 1A, the transformer 100 includes a primary winding L13 and a secondary winding L2, which are both located on the same metal layer. This metal layer is referred to below as the "first metal layer". It will be understood that in this description, any reference to the first metal layer is a general reference to the layer in which the windings L1, L2, L3 are formed, and is not a specific reference to the M1 metal layer. Similarly, any reference to a "second metal layer" is not a specific reference to the M2 metal layer, but merely denotes one of the metal layers, other than the layer in which the windings L1, L2, L3 are formed.

The primary winding L13 comprises a first winding segment (or coil) L1 and a second winding segment (or coil) L3. The first winding segment L1 is adjacent a first portion of the second winding L2. The second winding segment L3 is adjacent a second portion of the second winding L2.

One of the first L1 and second L3 segments of the first winding L13 has a conductive connection to the second winding L2 in the first metal layer, and the other of the first L1 and second L3 segments has a conductive connection to the second winding L2 at least partially in a second metal layer other than the first metal layer. For example, in FIG. 1A, the segment L1 is connected to the secondary winding (or coil) L2 by metal bridge B2 formed on a separate metal layer and connecting vias (not shown in FIG. 1A). The segment L3 is connected to the secondary winding L2 by metal bridge B1 formed on the same metal layer as the primary winding L13 and secondary winding L2. In other embodiments, B2 is formed in the same layer as the coils L13 and L2, and B1 is formed in another layer.

In the example of a 1:1 single turn device 100, the secondary winding L2 is comprised of a single segment, formed on the same metal layer as the segments L1 and L3 comprising the primary winding L13. In some embodiments, an optional center tap CT1 is provided in the second winding L2.

The first L1 and second L3 winding segments each extend about halfway around the second winding L2 on opposite sides of the second winding. The length of the first segment L1 overlapping the second segment L2 is slightly less than 0.5 the length of second segment L2, to provide a spacing between ports P3 and P4, and a space between P1 and P2. Similarly, the length of the second segment L3 overlapping the second segment L2 is slightly less than 0.5 the length of second segment L2. In some embodiments, L2 is slightly smaller than the sum of L1 and L3. For example the ratio L2/(L1+L3) may be in the range from about 75% to about 95% due to the spacings between each of the turns. And L1 may be equal to or different from L3. In some embodiments, L1 differ from L3 because of the location of the capacitors C1 and C2.

Figure 1B:
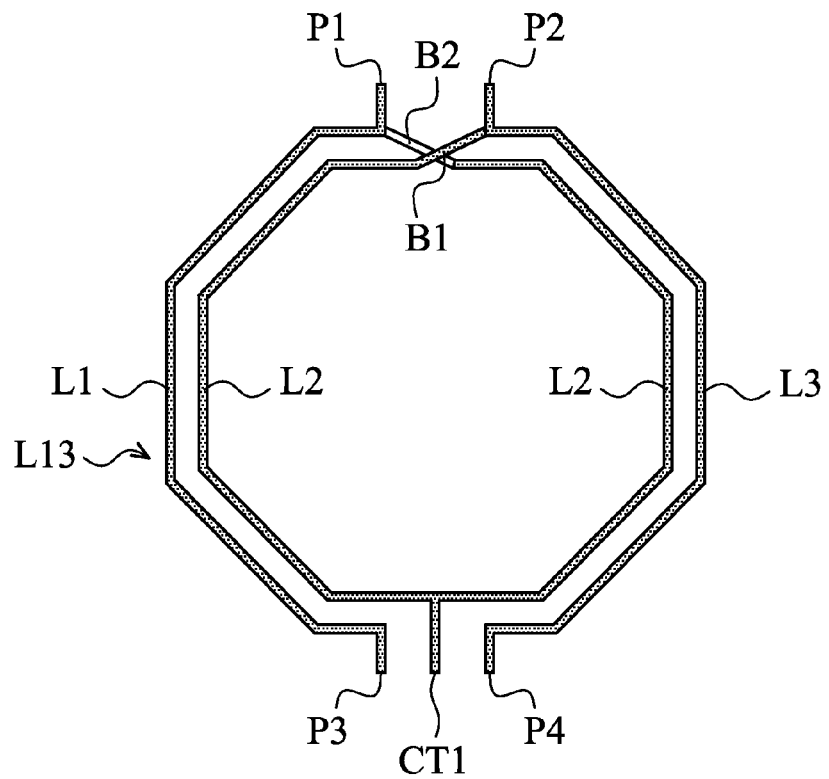
FIG. 1B is a plan view of a transformer having a generally octagonal shape.

Although the windings L13 and L2 of FIG. 1A are square in shape, the coils may have other shapes. For example, FIG. 1B shows a variation of the topology in which each winding L13 and L2 is octagonal. Components in FIGS. 1A and 1B having the same function are indicated by the same reference numeral (although performance may differ between these shapes). In some embodiments, winding L13 is the primary winding, and L2 is the secondary. In other embodiments, L13 is the secondary winding and L2 is the primary.

Figure 1C:
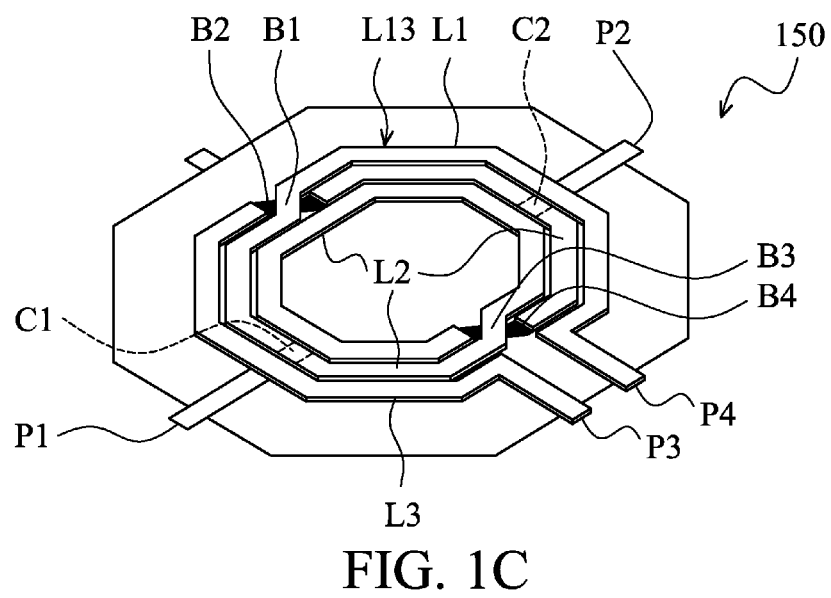
FIG. 1C is a top isometric view of another embodiment of the transformer.
Figure 4:
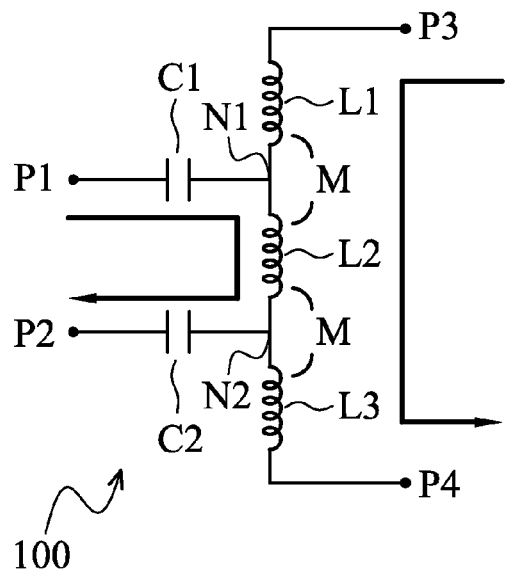
FIG. 4 is a schematic diagram of the transformer of FIG. 1A.

FIG. 4 is a schematic diagram of the transformer/balun 100 of FIG. 1A, 1B or 1C. The electronic device comprises first (L1), second (L2) and third (L3) inductors connected in series and formed in a metal layer over a semiconductor substrate (shown in FIG. 2). The first L1 and second L2 inductors have a mutual inductance with each other, designated M. The second L2 and third L3 inductors also have a mutual inductance with each other, designated M. The mutual inductance M is tunable by varying C1 and/or C2, since the ratio of (k/M) is a fixed value for given inductance values of L13 and L2. A first capacitor C1 has a first electrode connected to a first node N1. The first node is conductively coupled between the first L1 and second L2 inductors. A second capacitor C2 has a second electrode connected to a second node N2. The second node N2 is conductively coupled between the second L2 and third L3 inductors.

The second winding L2 is coupled between a first port P1 of the device 100 and a second port P2 of the device. The first capacitor C1 is coupled between the second winding L2 and the first port P1. The second capacitor C2 is coupled between the second winding L2 and the second port P2. The device 100 has a third port P3 and a fourth port P4. The first winding segment (coil) L1 is coupled between the first node N1 and the third port P3. The second winding segment L3 is coupled between the second node N2 and the fourth port P4.

The coil L2 is included in both the first and second windings of the transformer. Additionally, there is mutual inductance between the first winding L13 and the second winding L2. This configuration allows the RF signals to pass directly from the first winding P1-L2-P2 to the second winding P3-L1-L2-L3-P4 by a real metal connection, as opposed to just by mutual coupling. Thus, there is an RF path from each port to each other port. By using a relatively large capacitor, this configuration provides capacitive coupling for DC blocking.

Figure 1D:
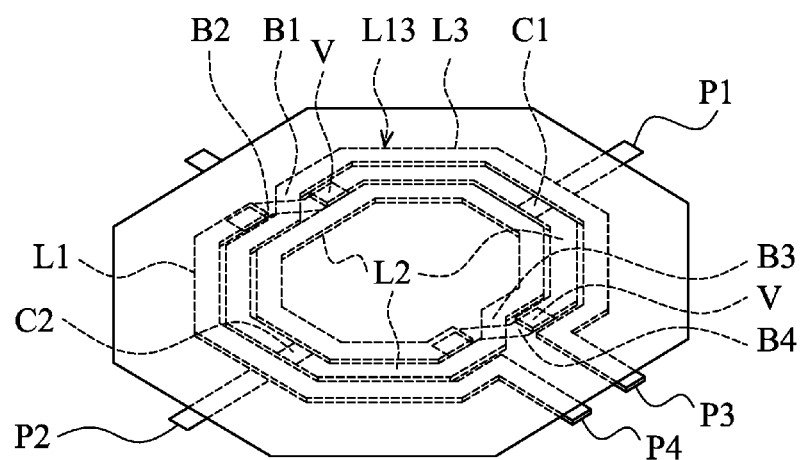
FIG. 1D is a bottom isometric view of the transformer of FIG. 1C.

FIGS. 1C and 1D show an alternative embodiment of a transformer 150 having three turns. Although the layout of transformer 150 differs from that of FIG. 1A, transformer 150 is represented by the same schematic diagram in FIG. 4 (described above), and corresponding elements are represented by like reference numerals. In FIGS. 1C and 1D, the first segment L1 and second segment L3 of the first winding are each about 0.75 turns (270 degrees), and the second winding L2 is 1.5 turns (540 degrees). Thus, L1 includes about 0.5 turn in the outer turn and about 0.25 turn in the middle turn. Similarly, L3 includes about 0.5 turn in the outer turn and about 0.25 turn in the middle turn. L2 includes the full inner turn and about 0.5 turn in the middle turn. As best seen in FIG. 1D, two additional bridge segments B3 and B4 in the first and second metal layers, respectively, provide additional connections between the portions of the second winding L2 in the middle turn and the portions of L2 in the inner turn. Additional Vias V are provided to connect the bridge segment B4 to the L2 portions in the middle and inner turns. One of ordinary skill can readily design other layouts having any desired number of turns (e.g., four, six or eight turns) according to the schematic of FIG. 4, or the schematic of FIG. 5, discussed below.

Figure 5:
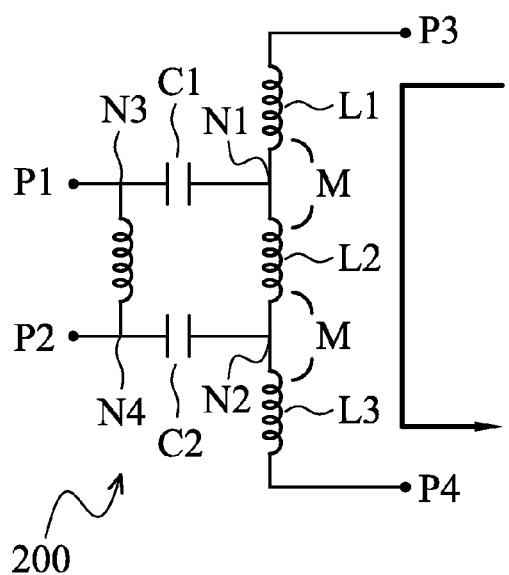
FIG. 5 is a schematic diagram of a variation of the transformer of FIG. 4.

FIG. 5 is a schematic of a variation of the transformer of FIG. 4, in which a fourth coil L4 connects a third node N3 to a fourth node N4. The third node N3 is between the first capacitor C1 and the first port P1, and the fourth node N4 is between the second capacitor C2 and the second port P2. The fourth coil L4 may optionally be included for providing a DC current path between P1 and P2 in the first winding, so that only AC current passes through the second winding.

In other embodiments, optional additional inductors (not shown) are provided between ports P1 and P2, and between ports P3 and P4, to provide a DC current path.

In some embodiments, L1 is the same as L3, where, L1, L3 are both approximately half of the outer turn (turns) and L2 is the inductor of inner turn (turns). For example, using the configuration of FIG. 1A, in a 60 GHz application, L1+L2+L3 may be around 80 nH~100 nH. In other embodiments (or if designed for use at other frequencies) L1, L2, L3 might differ because of the layout shape. The capacitance of C1, C2 is dependent on the varactor/MIM/MOM used. L4 could be small around 80 pH~100 pH for 60 GHz application. For example, In one embodiment, L1=L3=35 pH and L2=28 pH, L4=80 pH, C1=C2=2 pF. In other embodiments, the inductors and capacitors have larger or smaller values.

Alternatively, for operation at a lower frequency (e.g., 17 GHz), the inductances and capacitances may be L1=L3=115 pH, L2=97 pH. C1=C2>1 pF. L4=97 pH. A transformer having these components could be substituted into a voltage controlled oscillator, such as a VCO described in Alan W. Ng et al, "A 1V 17 GHz 5 mW Quadrature CMOS VCO based on Transformer Coupling", 2006 IEEE International Solid-State Circuits Conference, IEEE 2006, which is incorporated by reference herein in its entirety.

In some embodiments, the transformer 100 are tuned to have a different inductance by changing coil length and/or the spacing between turns. By varying the values of C1/C2, the input/output impedance, inductance and K value of this transformer are changed.

Although the examples discussed above include two capacitors C1 and C2, in other embodiments, only one of the two capacitors is included, and the other one of the two capacitors is omitted.

Figure 2:
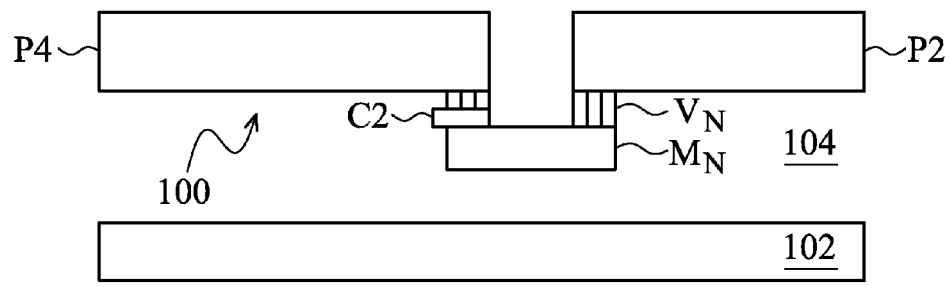
FIG. 2 is a side cross section of the transformer of FIG. 1A, including metal-insulator-metal (MIM) or metal-oxide-metal (MOM) capacitors.

FIG. 2 is a cross sectional view of the transformer/balun 100. Referring to FIG. 2, the coils L1, L2 and L3 of transformer/balun 100 are formed in a metal layer above a semiconductor substrate 102. For example, the substrate 102 may have a plurality of back-end-of-line (BEOL) interconnect layers, comprising inter-metal-dielectric (IMD) material 104 with several metal layers $M_1$-$M_T$ and via layers $V_1$-$V_T$ formed therein. In some embodiments, the transformer coils L1, L2, L3 are formed in the metal-5 ($M_5$) or metal-6 ($M_6$) layer of the interconnect structure. In other embodiments, the coils L1, L2 and L3 may be formed in another metal layer.

In the embodiment of FIG. 2, the capacitors C2 and C1 (shown in FIG. 4) are either metal-insulator-metal (MIM) capacitors or metal-oxide-metal (MOM) capacitors.

A MIM capacitor is formed between two metal layers, and has a thicker insulation layer with a higher dielectric constant (e.g., a silicon nitride layer). A MIM capacitor may provide a more accurate capacitance value. A MOM capacitor can use a silicon oxide layer as its dielectric, and has a thinner insulating layer. A MOM capacitor may occupy a smaller area for a given capacitance. One of ordinary skill can readily select an appropriate MIM or MOM capacitor for any given transformer design.

FIG. 2 shows the capacitor C2 formed with its top electrode over one of the metal layers $M_N$ and connected to the second segment L3 (of the first winding L13) and the second winding L2 by way of vias in the $V_N$ layer. Similarly, the bottom electrode of capacitor C2 is formed in the metal layer $M_N$, and is connected to the port P2 by way of vias in the $V_N$ layer.

Figure 3:
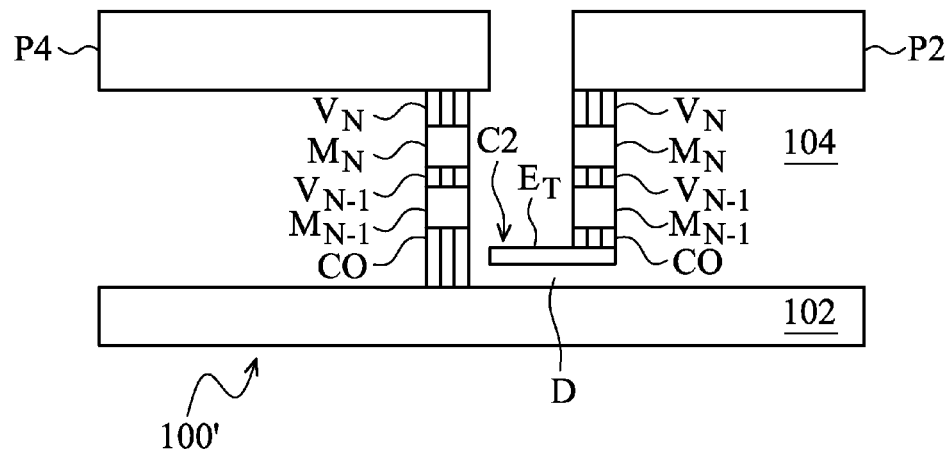
FIG. 3 is a side cross section of the transformer of FIG. 1A, including metal-oxide-semiconductor capacitors.

In the embodiment of FIG. 3, the capacitors C2 and C1 (shown in FIG. 4) are metal-oxide-semiconductor (MOScap) capacitors or varactors. Thus, the capacitor dielectric D is formed in the gate insulation layer, and the capacitor top electrode $E_T$ is formed in the gate electrode (poly) layer. A plurality of contacts CO connect the capacitors C1, C2 to the metal patterns in the interconnect layers $M_1$-$M_T$. Alternatively, the adjustable capacitors C1, C2 may be any capacitor formed by the OD, the poly layer and the contact. The remaining connections in the BEOL layers between the capacitors and the ports P1 and P2 are determined in conjunction with the routing of the BEOL lines and vias for other circuit devices.

Because the capacitors C1, C2 in FIG. 3 are varactors, the thickness of the depletion zone varies with the applied bias voltage, so the capacitance can be varied. By varying the capacitance of C1 and C2, the coupling coefficient k and the self-reflectance S11 can also be adjusted.

FIG. 3 shows the capacitor C2 formed with its top electrode $E_T$ in the poly layer connected to the second segment L3 (of the first winding L13) and the second winding L2 by way of vias in the $V_N$ layer. The bottom electrode of capacitor C2 is formed in the N well and is connected to the port P2 by way of contacts CO, conductive patters in the metal layers and conductive vias in the via layers. Although FIG. 3 only shows two of the metal layers $M_{N-1}$ and $M_N$, any number of metal layers may be included in the interconnect.

SPICE simulations were performed using the same winding configuration shown in FIG. 1A, with different values of C1 and C2 from 0.5 to 25 picofarads, as well as a transformer without the capacitors C1, C2. Without the capacitors C1, C2, the coupling coefficient k ranged from about 0.4 to about 0.6 (depending on frequency). With the decoupling capacitors C1, C2, the coupling coefficient was at least about 0.78 throughout the frequency range up to 80 GHz, and a some frequencies approached 1.0. The Q value is also improved. In general, the smaller capacitance values provided higher k values. The increase in k of about 0.4 is achieved without increasing the area (footprint) of the transformer. At the same time, the real impedance of the coils L1, L2, L3 is unchanged, so that the loss of the device is substantially the same when tuning the capacitance.

Although FIG. 2 shows an embodiment in which capacitors C1, C2 are all MIM or MOM capacitors, and FIG. 3 shows an embodiment in which the capacitors are all MOScaps, other embodiments include a combination of varactor and MIM or MOM capacitors. For example, one or both of the capacitors C1, C2 may include a MIM or MOM capacitor in parallel with a varactor, so the capacitance has a fixed component and a variable component. This allows a large capacitance with fine tuning capability.

Any of the transformers shown in FIGS. 1A, 1B, 4 and 5 may be implemented using MIM or MOM capacitors as shown in FIG. 2, or with MOScap varactors as shown in FIG. 3.

Although FIGS. 2 and 3 show the capacitors C1, C2 directly under the coils L1, L2, L3, the physical location of the capacitors may vary, to accommodate the other devices and wirings of the IC. However, a surface mounted device (SMD) capacitor or capacitor produced by packaging method (e.g., the capacitor is formed or mounted on the package substrate or formed by a related method, such as a through-silicon via, TSV, process.) may also be used to provide C1 and C2. For example, a TSV process a package solution that takes the place of bond wires. However, a TSV substrate mounted by micro-bumps with decoupling capacitors inside the inter-metal layers, may be used to provide the capacitors.

Figure 9:
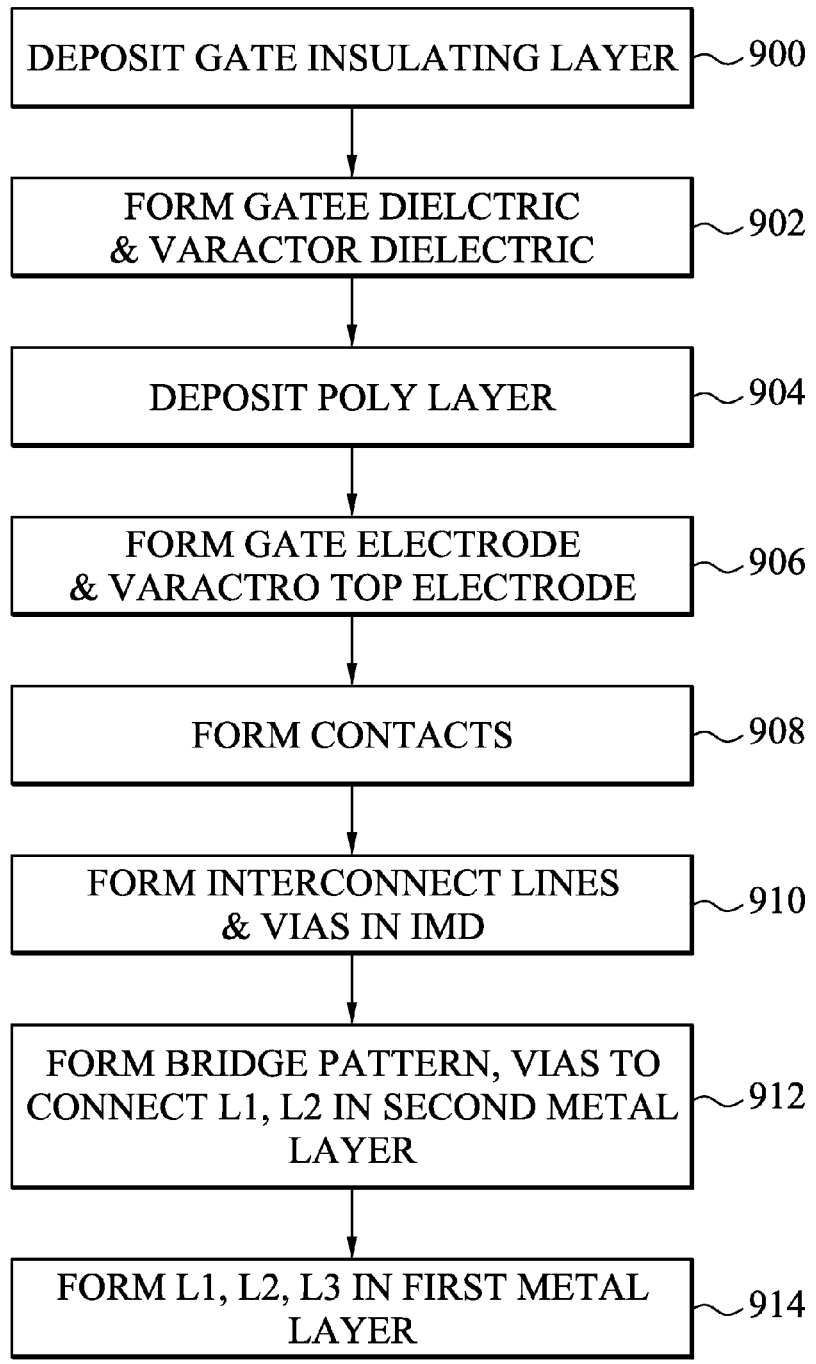
FIG. 9 is a flow chart of a fabrication method including MOS capacitor formation.

FIG. 9 is a flow chart of a method for forming the transformer 100, using MOS capacitors. One of ordinary skill in the art is familiar with the basic CMOS process, and the basic steps are not described in detail herein.

A method for forming the IC includes first forming the active devices (transistors, diodes). At step 900, the gate insulation layer is deposited over the substrate.

At step 902, the dielectric layers of the first and second capacitors C1, C2 are formed, during gate insulating layer patterning step.

At step 904, the gate polysilicon layer is deposited.

At step 906 the capacitor top electrodes are formed during the gate electrode polysilicon patterning step.

At step 908, the contacts CO are then formed.

At step 910, the interconnect structure is formed. The connections between the contacts CO and the windings L13 and L2 are formed using conductive lines and vias in the various interconnect layers $M_1$-$M_T$ and $V_1$-$V_T$. The top electrode of the first capacitor C1 is thus connected to the first node N1, which is to be conductively coupled between the first segment L1 and the second coil L2. Similarly, the top electrode of the second capacitor C2 is thus connected to the second node N2, which is to be conductively coupled between the second segment L3 and the second coil L2.

At step 912, while forming the interconnect layers, the bridge structures connecting the first winding L13 and the second winding L2 are formed. One of the first coil L1 and the third coil L3 has a connection to the second coil L2 in a second metal layer (different from the first metal layer in which the coils L1, L2 and L3 are formed). This connection may be made through the metal and via layers below the first layer. Thus, at least one conductive line B2 is formed in at least a second metal layer $M_N$ between the substrate 102 and the first metal layer (which contains coils L1, L2, L3). Then a plurality of conductive vias are formed in at least one via layer $V_N$ to connect the bridge pattern B2 to the second coil L2 and one of the coils L1 and L3. At least one of the vias contacts the at least one conductive line and the second coil L2, and at least one of the vias contacts the at least one conductive line and the one of the coils L1, L3.

At step 914, the coils L1, L2 and L3 are formed in the first metal layer, with vias providing a conductive connection to the bridge pattern B2, and the connections from nodes N1 and N2 to the capacitors.

Figure 10:
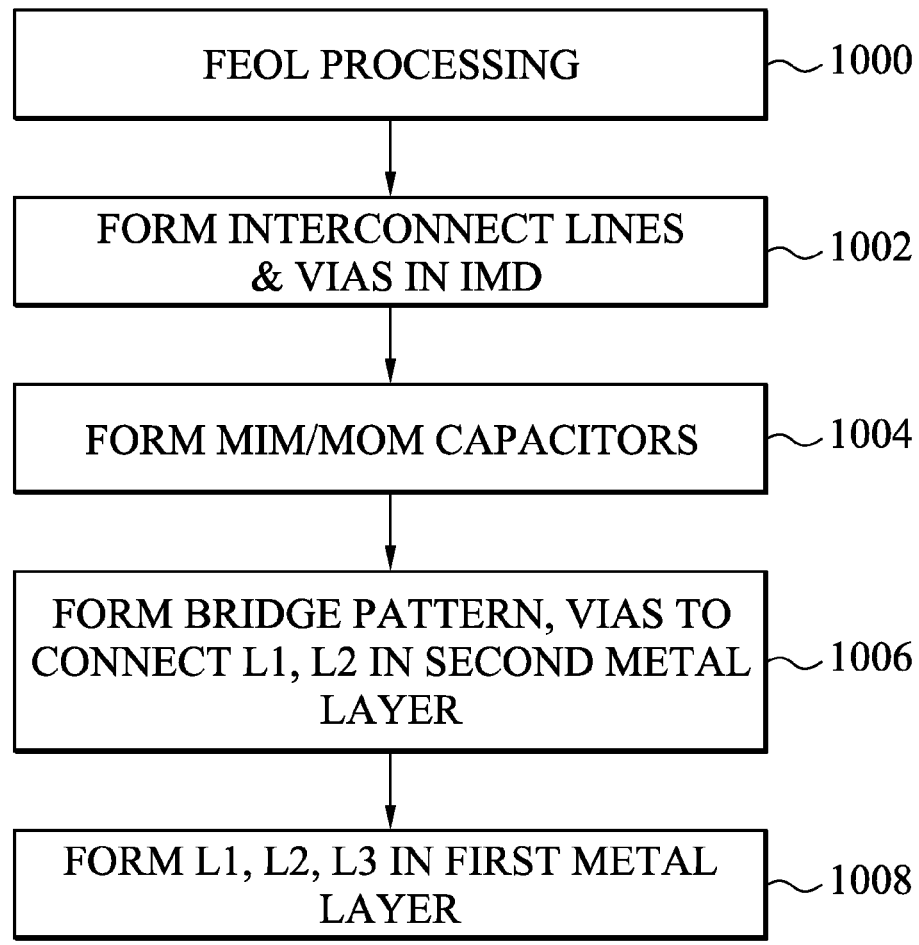
FIG. 10 is a flow chart of a fabrication method including MIM/MOM capacitor formation.

FIG. 10 is a flow chart of an exemplary method if MIM or MOM capacitors are used. At step 1000, front-end-of-line (FEOL) processing is performed, including the active device layers and the first IMD layer. The active device layers are formed.

At step 1002, the interconnect structure is formed, including lines in metal layers and conductive plugs in via layers.

At step 1004, during interconnect structure processing, the capacitors C1, C2 are formed within the interconnect structure (e.g., at the M5 and M6 layers).

At step 1006, during interconnect structure processing, the connections between the capacitors and the windings L13 and L2 are also formed using conductive lines and vias in the various interconnect layers $M_1$-$M_T$ and $V_1$-$V_T$. Bridge patterns are formed to connect L1 and L2 in a second metal layer.

At step 1008, the inductors L1, L2 and L3 are formed in the first metal layer.

Figure 6:
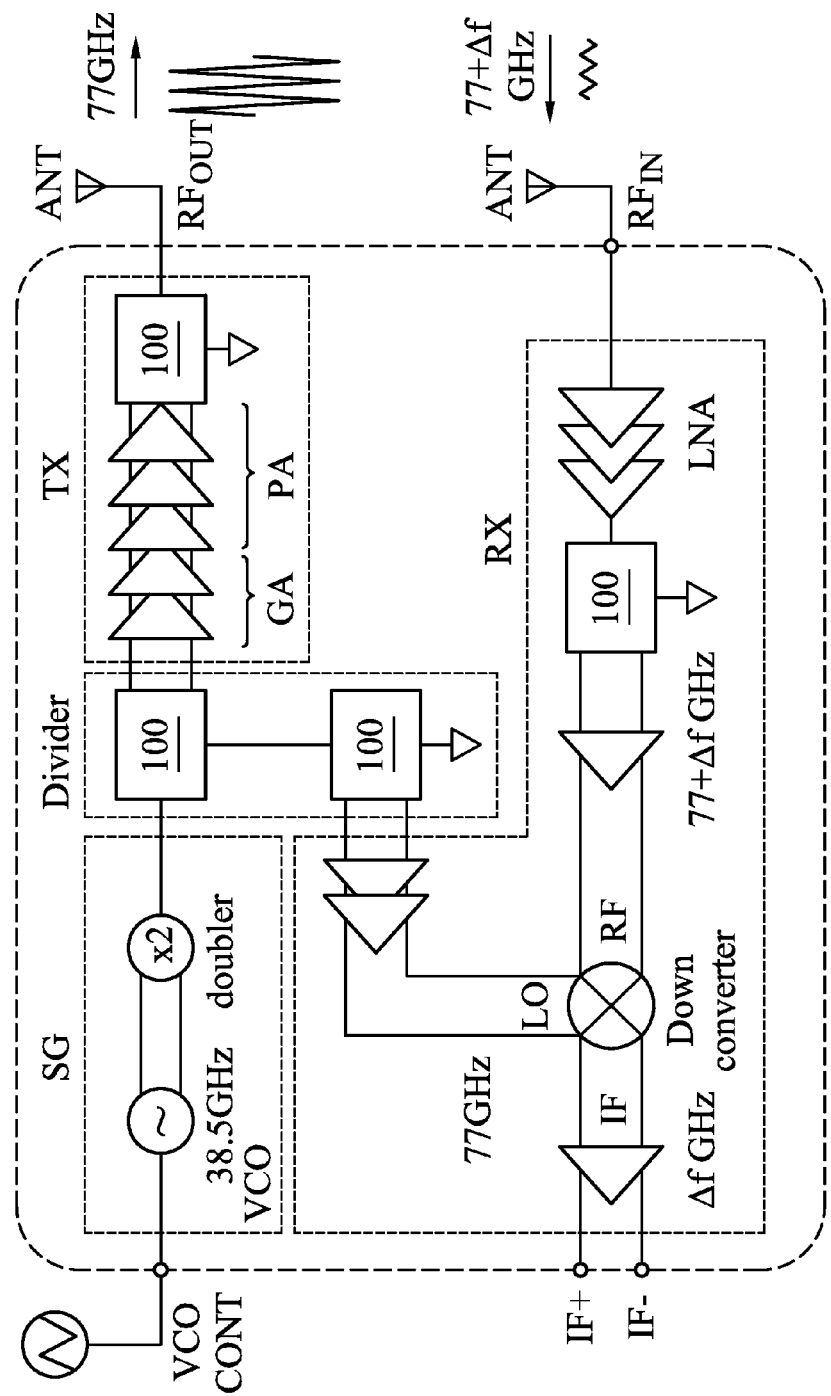
FIG. 6 is a schematic diagram of a transceiver that includes the transformer of FIG. 1A.
Figure 7:
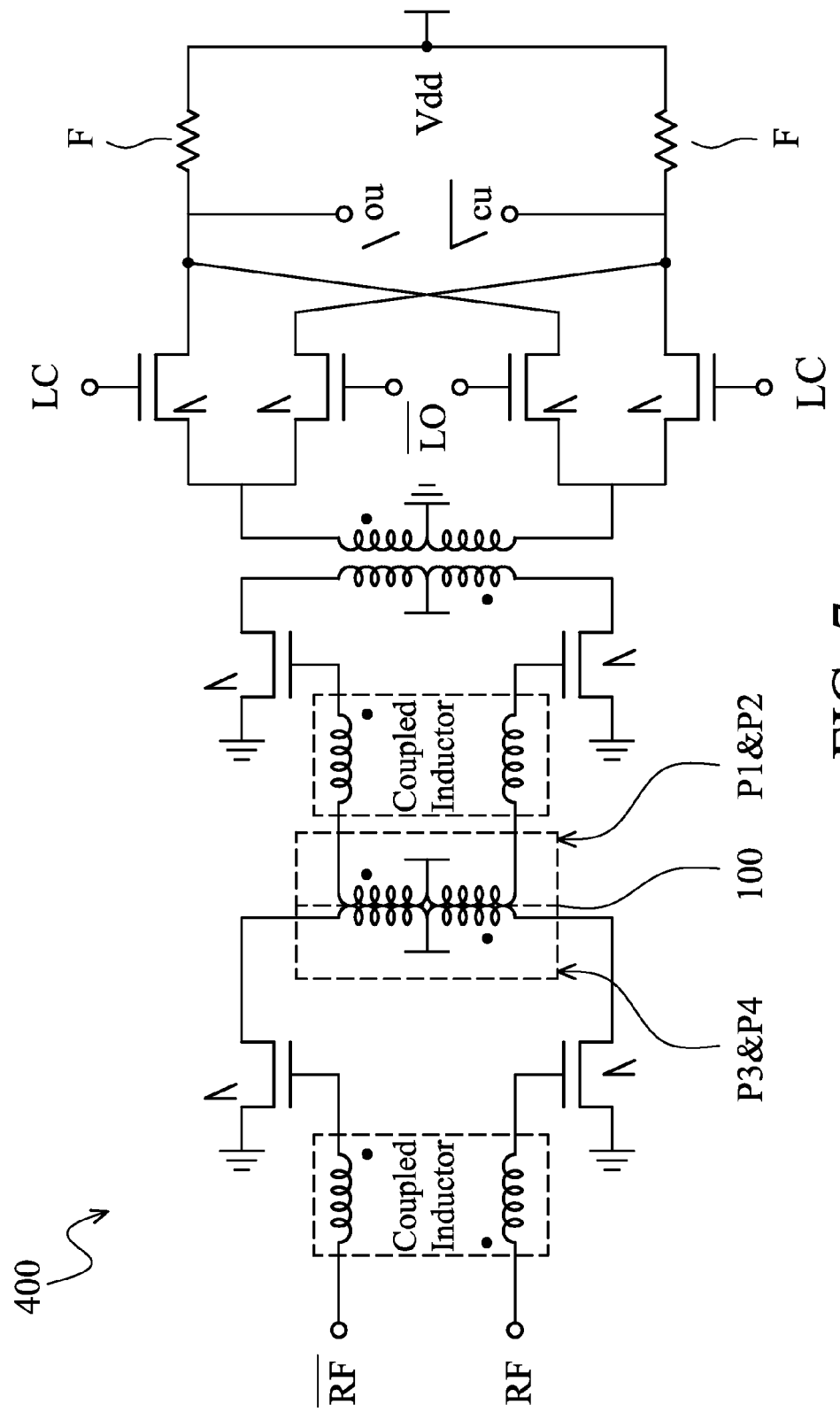
FIG. 7 is a schematic diagram of a receiver including the transformer of FIG. 1A.
Figure 8:
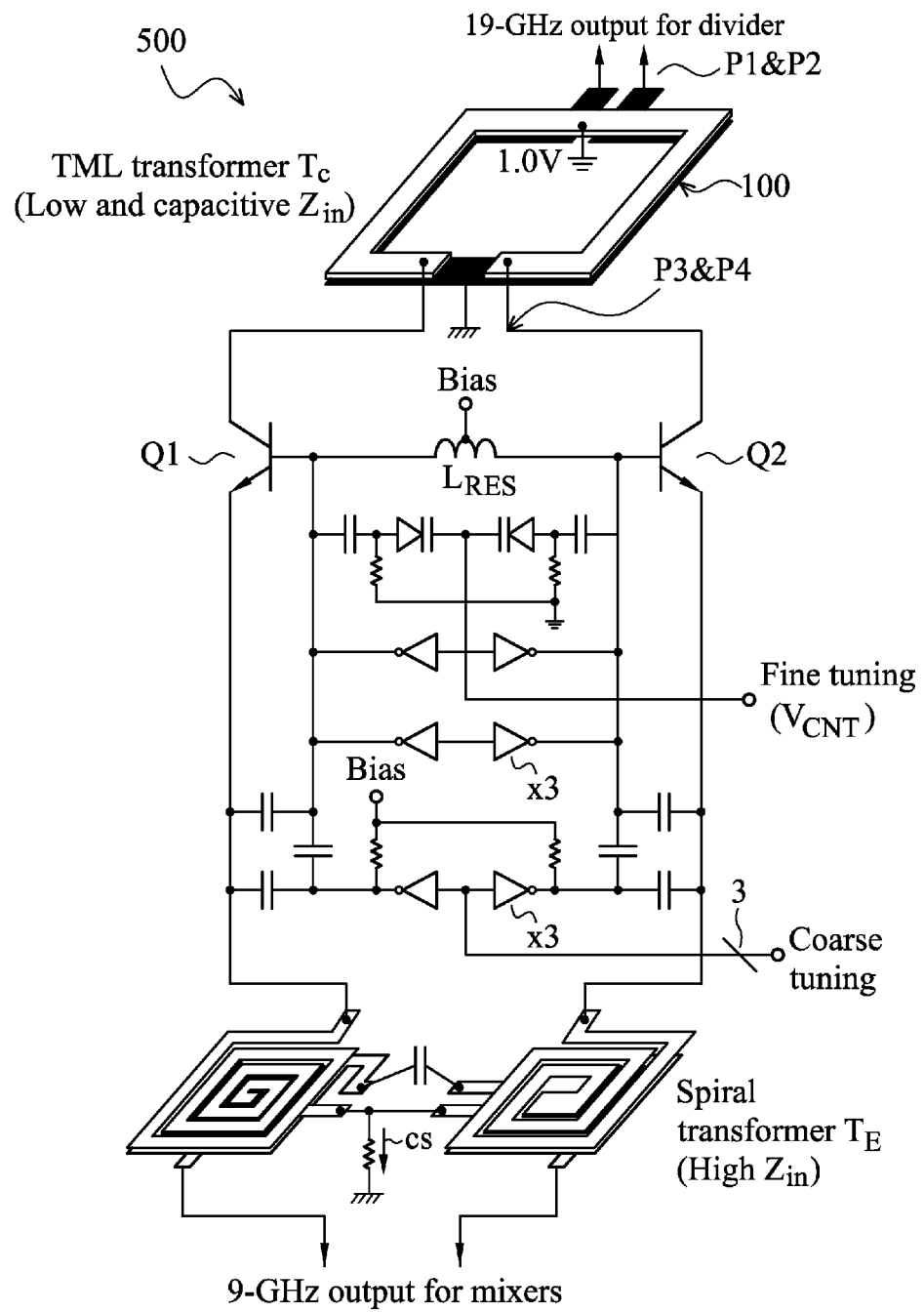
FIG. 8 is a schematic diagram of a voltage controlled oscillator (VCO) including the transformer of FIG. 1A.

FIGS. 6, 7 and 8 include non-limiting examples of circuits into which a transformer/balun 100 as described herein can be substituted. FIG. 6 is a block diagram of a transceiver 300 that includes the transformer of FIG. 1A, used as a matching network 100a and as a balun (100b-100d) to convert differential signals to single-ended signals. In FIG. 6, the transformer 100 is substituted for transformers shown in a transceiver described in Yoichi Kawano, et al., "A 77 GHz Transceiver in 90 nm CMOS" 2009 International Solid State Circuit Conference, IEEE 2009, which is incorporated by reference herein in its entirety.

FIG. 7 is a schematic diagram of a receiver 400 into which the transformer of FIG. 1A is substituted. In the receiver 400, the second winding L2 has: a first center tap connecting the second winding to ground, and a second center tap connecting the second node to VDD. For RF signals, VDD is also an AC ground. Thus, P3 and P4 are for the DC loop side; and P1 and P2 are only for RF signals. The remaining components of the receiver 400 are described in Daquan Huang et al., "A 60 GHz CMOS Differential Receiver Frong-End Using On-Chp Transformer for 1.2 Volt Operation with Enhanced Gain and Linearity," 2006 Symposium on VLSI Circuits Digest of Technical Papers, IEEE 2006, which is incorporated by reference herein in its entirety.

FIG. 8 is a schematic diagram of a voltage controlled oscillator (VCO) 500 into which the transformer of FIG. 1A is substituted. In FIG. 8 the transformer inputs P1, P2 provide the divider outputs, and P3 and P4 are connected to the oscillator inputs. As in the example of FIG. 7, two center taps are provided. One center tap is connected to a 1.0V reference and is connected to P3 and P4, and provide a DC current to drive the circuit. The other center tap connects P1 or P2 to ground. The remaining components of the VCO 500 are described in Takahiro Nakamura et al. "A 20-GHz 1-V VCO with Dual-Transformer Configuration and a Pseudo-Static Divider on Self-Stabilized Concept," IEEE 2009, which is incorporated by reference herein in its entirety.

One of ordinary skill will recognize that these are only examples, and that the transformers described herein have many different applications.

In some embodiments, an electronic device comprises a first winding formed in a first metal layer above a semiconductor substrate, the first winding having first and second segments. A second winding is formed in the first metal layer. The first segment is adjacent a first portion of the second winding. The second segment is adjacent a second portion of the second winding. A first capacitor has a first electrode connected to a first node. The first node is conductively coupled between the first segment and the second winding. A second capacitor has a second electrode connected to a second node. The second node is conductively coupled between the second segment and the second winding.

In some embodiments, an electronic device comprises first, second and third inductors connected in series and formed in a metal layer over a semiconductor substrate. The first and second inductors have a mutual inductance with each other. The second and third inductors having a mutual inductance with each other. A first capacitor has a first electrode connected to a first node. The first node is conductively coupled between the first and second inductors. A second capacitor has a second electrode connected to a second node. The second node is conductively coupled between the second and third inductors.

In some embodiments, a method comprises forming a first coil, a second coil and a third coil in a first metal layer above a semiconductor substrate. The first coil is adjacent a first portion of the second coil. The third coil is adjacent a second portion of the second coil. A first capacitor is formed having a first electrode connected to a first node. The first node is conductively coupled between the first and second coils. A second capacitor is formed having a second electrode connected to a second node. The second node is conductively coupled between the second and third coils.

The transformers/baluns described herein solve the tradeoff between the coupling coefficient k and high resonance frequency. High values of k and Fsr can both be achieved, even for advanced technology nodes (with smaller critical dimensions such as mm wave).

Further the k value and mutual inductance M could be tunable, by using a varactor for the capacitors C1, C2. Further by tuning the capacitance, the reflectance parameter S is also tunable. Thus the transformer has applications for VCO and/or impedance matching. The transformer can be applied in higher frequency ranges for tuning mutual inductance. The transformer can advantageously be used for a transceiver, and may be injected from an antenna. Further, the transformer may be used for impedance matching, or as a band pass filter.

A circuit incorporating the transformer described herein as a balun (one port connected to ground) does not require a separate ESD protection circuit. The ESD is sinked to ground because one of the inductors is connected to the ground.

Although an example is provided above in which the primary winding L13 has a single turn and the secondary L2 has a single turn, in other embodiments, the primary and/or secondary may have more than one turn in the first metal layer, with additional bridges between turn segments of the first or second winding by way of vias and line patterns in the second (or another) metal layer.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
    forming a first coil, a second coil and a third coil in a first metal layer above a semiconductor substrate, the first coil adjacent a first portion of the second coil, the third coil adjacent a second portion of the second coil, wherein one of the first and third coils has a connection to the second coil in the first metal layer;
    connecting the second coil to the other of the first and third coils by forming at least one conductive line in a second metal layer other than the first metal layer,
    forming a first capacitor having a first electrode connected to a first node, the first node being conductively coupled between the first and second coils; and forming a second capacitor having a second electrode connected to a second node, the second node being conductively coupled between the second and third coils.

2. The method of claim 1, wherein the step of connecting the second coil to the other of the first and third coils further comprises forming a plurality of conductive vias, at least one of the vias contacting the at least one conductive line and the second coil, and at least one of the vias contacting the at least one conductive line and the other of the first and third coils.

3. The method of claim 1, wherein the step of forming the first, second and third coils includes forming the first coil adjacent approximately a first half of the second coil and forming the third coil adjacent approximately a second half of the second coil, the second portion opposite the first portion.

4. The method of claim 1, wherein the steps of forming the first and second capacitors include forming metal-insulator-metal capacitors or metal-oxide-metal capacitors.

5. The method of claim 1, wherein the first and second capacitors are metal-oxide-semiconductor capacitors.

6. The method of claim 1, wherein the steps of forming the first and second capacitors include forming metal oxide semiconductor varactors.

7. The method of claim 1, further comprising:
coupling the second winding between a first port of the device and a second port of the device,
coupling the first capacitor between the second winding and the first port, and
coupling the second capacitor between the second winding and the second port.

8. The method of claim 1, further comprising
forming a fourth coil;
coupling the second coil between a first port of the device and a second port of the device, and
coupling the fourth coil between a third node and a fourth node, the third node connected between the first capacitor and the first port, the fourth node connected between the second capacitor and the second port.

9. A method comprising:
forming a first winding in a first metal layer above a semiconductor substrate, the first winding having first and second segments;
forming a second winding in the first metal layer, the first segment adjacent a first portion of the second winding, the second segment adjacent a second portion of the second winding, the second winding coupled between a first port of the device and a second port of the device;
connecting a first electrode of a first capacitor to a first node, the first node being conductively coupled between the first segment and the second winding;
connecting a second electrode of a second capacitor to a second node, the second node being conductively coupled between the second segment and the second winding; and
connecting a third node to a fourth node by way of a coil, wherein the third node is between the first capacitor and the first port, and the fourth node is between the second capacitor and the second port.

10. The method of claim 9, further comprising:
coupling the second winding to a first port and a second port;
coupling the first capacitor between the second winding and the first port; and
coupling the second capacitor between the second winding and the second port.

11. The method of claim 10, further comprising:
coupling the first segment to a third port; and
coupling the second segment to a fourth port.

12. A method comprising:
forming first, second and third inductors connected in series in a first metal layer over a semiconductor substrate, the first and second inductors having a mutual inductance with each other, the second and third inductors having a mutual inductance with each other;
connecting a first capacitor having a first electrode to a first node, the first node being conductively coupled between the first and second inductors; and
connecting a second capacitor having a second electrode to a second node, the second node being conductively coupled between the second and third inductors.

13. The method of claim 12, wherein the steps of forming the first and second capacitors include forming metal-insulator-metal capacitors or metal-oxide-metal capacitors.

14. The method of claim 12, wherein the first and second capacitors are metal-oxide-semiconductor capacitors.

15. The method of claim 12, wherein the first and second capacitors are varactors.

16. The method of claim 15, further comprising tuning a mutual inductance between the second inductor and one of the first or third inductor by varying a capacitance of the varactors.

17. The method of claim 12, further comprising:
coupling the first inductor between the first node and a third port,
coupling the third inductor between the second node and a fourth port, and
connecting a fourth inductor between a third node to a fourth node, wherein the third node is between the first capacitor and the first port, and the fourth node is between the second capacitor and the second port.

18. The method of claim 12, further comprising:
connecting the second inductor to ground; and
connecting the second node to VDD.

19. The method of claim 17, further comprising:
connecting the second inductor to a first center tap; and
connecting the second node to a second center tap.

20. The method of claim 16, wherein one of the first and third inductors has a connection to the second inductor in the first metal layer, the method further comprising connecting the second inductor to the other of the first and third inductors by forming at least one conductive line in a second metal layer other than the first metal layer.

\* \* \* \* \*